US010078273B2

(12) United States Patent
Schmitt-Weaver et al.

(10) Patent No.: US 10,078,273 B2
(45) Date of Patent: Sep. 18, 2018

(54) LITHOGRAPHIC APPARATUS WITH DATA PROCESSING APPARATUS

(71) Applicant: ASML Netherlands B.V., Veldhoven (NL)

(72) Inventors: Emil Peter Schmitt-Weaver, Eindhoven (NL); Wolfgang Henke, Kempen (DE); Christopher Prentice, Grenoble (FR); Frank Staals, Eindhoven (NL); Wim Tjibbo Tel, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 10 days.

(21) Appl. No.: 15/121,340

(22) PCT Filed: Dec. 17, 2014

(86) PCT No.: PCT/EP2014/078164
§ 371 (c)(1),
(2) Date: Aug. 24, 2016

(87) PCT Pub. No.: WO2015/131969
PCT Pub. Date: Sep. 11, 2015

(65) Prior Publication Data
US 2016/0370711 A1    Dec. 22, 2016

(30) Foreign Application Priority Data

Mar. 4, 2014 (EP) ...................................... 14157664

(51) Int. Cl.
*G03F 7/20* (2006.01)
*G03F 9/00* (2006.01)

(52) U.S. Cl.
CPC ...... *G03F 7/70641* (2013.01); *G03F 7/70725* (2013.01); *G03F 9/7019* (2013.01); *G03F 9/7026* (2013.01); *G03F 9/7092* (2013.01)

(58) Field of Classification Search
CPC ............. G03F 7/70641; G03F 7/70725; G03F 9/7019; G03F 9/7026; G03F 9/7092
See application file for complete search history.

(56) References Cited

U.S. PATENT DOCUMENTS 6,081,614 A    6/2000 Yamada et al.
6,674,510 B1    1/2004 Jasper et al.
(Continued)

FOREIGN PATENT DOCUMENTS

CN    101458457    6/2009
CN    101752228    6/2010
(Continued)

OTHER PUBLICATIONS

International Search Report and Written Opinion dated Mar. 18, 2015 in corresponding International Patent Application No. PCT/EP2014/078164.
(Continued)

*Primary Examiner* — Steven H Whitesell Gordon
(74) *Attorney, Agent, or Firm* — Pillsbury Winthrop Shaw Pittman LLP

(57) ABSTRACT

A lithographic apparatus applies a pattern onto a substrate using an optical projection system. The apparatus includes an optical level sensor and an associated processor for obtaining a height map of the substrate surface prior to applying the pattern. A controller uses the height map to control focusing with respect to the projection system when applying the pattern. The processor is further arranged to use information relating to processing previously applied to the substrate to define at least first and second regions of the
(Continued)

substrate and to vary the manner in which the measurement signals are used to control the focusing, between the first and second regions. For example, an algorithm to calculate height values from optical measurement signals can be varied according to differences in known structure and/or materials. Measurements from certain regions can be selectively excluded from calculation of the height map and/or from use in the focusing.

20 Claims, 7 Drawing Sheets

(56) References Cited

U.S. PATENT DOCUMENTS

| | | | |
|---|---|---|---|
| 7,248,337 | B2 | 7/2007 | Teunissen et al. |
| 7,265,364 | B2 | 9/2007 | Teunissen et al. |
| 7,411,667 | B2 | 8/2008 | Van Asten et al. |
| 7,502,096 | B2 * | 3/2009 | Tempelaars ............ G03F 9/7011 355/53 |
| 7,746,484 | B2 | 6/2010 | Van De Vin et al. |
| 7,835,017 | B2 | 11/2010 | Modderman et al. |
| 8,021,809 | B2 | 9/2011 | Van Dijk |
| 8,842,293 | B2 | 9/2014 | Den Boef et al. |
| 9,360,769 | B2 | 6/2016 | Kisteman et al. |
| 2005/0134816 | A1 | 6/2005 | Modderman et al. |
| 2006/0274324 | A1 | 12/2006 | Van Asten et al. |
| 2007/0252963 | A1 | 11/2007 | Modderman et al. |
| 2009/0262320 | A1 | 10/2009 | Staals et al. |
| 2010/0233600 | A1 | 9/2010 | Den Boef et al. |
| 2011/0046918 | A1 | 2/2011 | Ravid et al. |
| 2011/0109889 | A1 * | 5/2011 | Van De Vin ............ G03B 27/58 355/55 |
| 2013/0050668 | A1 | 2/2013 | Kisteman et al. |
| 2013/0128247 | A1 | 5/2013 | Khuat Duy et al. |

FOREIGN PATENT DOCUMENTS

| | | |
|---|---|---|
| JP | 08-037149 | 2/1996 |
| JP | H08-78317 | 3/1996 |
| JP | 09-045608 | 2/1997 |
| JP | H11-176735 | 7/1999 |
| JP | 2000-323404 | 11/2000 |
| JP | 2005-354073 | 12/2005 |
| JP | 2006-308842 | 11/2006 |
| JP | 2007-515806 | 6/2007 |
| JP | 2007-273955 | 10/2007 |
| JP | 2008-160110 | 7/2008 |
| JP | 2009-188385 | 8/2009 |
| JP | 2009-239274 | 10/2009 |
| JP | 2011-40661 | 2/2011 |
| JP | 2013-110398 | 6/2013 |
| WO | 2013/029957 | 3/2013 |

OTHER PUBLICATIONS

Frank Kahlenberg et al., "Best focus determination: bridging the gap between optical and physical topography," Proc. of SPIE, vol. 6520, pp. 65200Z-1-65200Z-8 (Mar. 27, 2007).

Peng Liu et al., "Fast 3D thick mask model for full-chip EUVL simulations," Proc. of SPIE, vol. 8679, pp. 86790W-1-86790W-16 (Apr. 1, 2013).

Peng Liu et al., "A full-chip 3D computational lithography framework," Proc. of SPIE, vol. 8326, pp, 83260A-1-83260A-18 (Feb. 21, 2012).

Mehdi Miri et al., "Geometrical approach in physical understanding of the Goos-Haenchen shift in one- and two-dimensional periodic structures," Optics Letters, vol. 33, No. 24, pp. 2940-2942 (Dec. 15, 2008).

"GDSII," Wikipedia, http://en.wikipedia.org/wiki/GDSII, pp. 1-3 (Aug. 1, 2014).

Warren Grobman et al., "Reticle Enhancement Technology Trends: Resource and Manufacturability Implications for the Implementation of Physical Designs", International Symposium on Physical Design 2001, Sonoma, California, pp. 45-51 (Apr. 1-4, 2001).

Chinese Office Action dated Mar. 28, 2017 in corresponding Chinese Patent Application No. 201480076623.5.

Japanese Office Action dated Aug. 29, 2017 in corresponding Japanese Patent Application No. 2016-552539.

Notice of Reasons for Rejection issued in corresponding Japanese Patent Application No. 2016-552539, dated Mar. 6, 2018.

* cited by examiner

LITHOGRAPHIC APPARATUS WITH DATA PROCESSING APPARATUS

CROSS-REFERENCE TO RELATED APPLICATIONS

This application is the U.S. national phase entry of PCT patent application number PCT/EP2014/078164, filed Dec. 17, 2014, which claims the benefit of priority of is related to EP application number 14157664.5, filed Mar. 4, 2014, which is incorporated by reference herein in its entirety.

BACKGROUND

Field of the Invention

The present disclosure relates to lithographic apparatus. The disclosure relates in particular to the measurement of local height deviations, which are important for focusing in optical lithography. The disclosure further relates to methods of manufacturing devices by lithography, and to data processing apparatuses and computer program products for implementing parts of such apparatus and methods.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

The pattern is imaged onto the target portion of the substrate using a lenses (or mirrors) forming a projection system. When imaging the pattern onto the substrate it is desirable to ensure that an uppermost surface of the substrate (i.e. the surface onto which the pattern is to be imaged) lies within the focal plane of the projection system.

The surface of a substrate on which a pattern should be projected is never perfectly flat, but presents many local height deviations on both a large scale and smaller scale. Failure to adjust the focus of the projection system may result in poor patterning performance and consequently poor performance of the manufacturing process as a whole. Performance parameters such as critical dimension (CD) and CD uniformity in particular will be degraded by poor focus.

To measure these local height deviations, level sensors are normally integrated in the lithographic apparatus. These are optical sensors used to measure and the vertical position of the uppermost surface of the substrate at points all across the substrate, after it has been loaded into the lithographic apparatus. This set of measurements are stored in the form of a height map. The map is then used during exposure (patterning) to ensure that each portion of the substrate lies in the focal plane of the projection lens. Typically the height of a substrate table bearing the substrate will be adjusted continuously during exposure of successive portions on a substrate.

A known problem with optical level sensors is that different substrates, and different parts of a substrate, will interact differently with the measurement beams of radiation. In other words, the height measurements obtained by a level sensor are subject to process-dependent effects and do not always give the true height. In particular, an apparent surface depression is known to be caused when light reflected from the substrate is subject to so-called Goos-Haenchen shift. This effect is different for different materials and depends heavily on the structure and materials of several layers. Therefore the apparent surface depression can vary significantly from layer to layer, and between regions across the substrate. A heavily metallized region will reflect light more reliably than a region with predominantly dielectric material, for example. In U.S. Pat. No. 7,265,364 B2 (Tuenissen et al., ASML), a modified level sensor is described which measures height separately using S-polarized and P-polarized light to detect areas of high process dependency. The results of this detection are used to discard or correct height measurements obtained from particularly troublesome regions of the substrate.

US 2010/0233600 A1 (den Boef et al.) proposes an alternative level sensor using radiation in an ultraviolet (UV) wavelength range similar to that used in the projection system. The shorter wavelength radiation is less susceptible to process dependency. However, such UV level sensors are not available in existing apparatuses, and will still only measure the height at specific sample locations.

Another approach to correct for process dependency in leveling systems is to use 'non optical' inspection apparatuses to complement and calibrate the optical sensor. These non-optical sensors may be for example such as profilometers (available for example from KLA-Tencor, San Jose, Calif.) and/or Air Gauge sensors (as described for example by F. Kahlenberg et al., Proc. SPIE 6520, Optical Microlithography XX, 65200Z (Mar. 27, 2007)). These non-optical sensors can be employed to deliver true height measurements, and to calculate corrections for use with optical sensor height measurements. However, the use of these sensors may be highly time consuming and they are not generally suitable for integration in the lithographic apparatus itself. Therefore, profilometers and Air Gauge sensors may be employed, for instance, to measure the height of specific fields and/or specific areas of the field of a few wafer samples in an "off-line" situation, that is outside the mass production process. Height measurements obtained with Air Gauge sensors may then be used, for example, to obtain a map of corrections to be applied to measurements obtained with optical sensors.

It is also noted at this point that the spatial resolution of level sensors and non-optical inspection apparatuses may be limited. Existing sensors do not allow the height map to represent precisely the boundary between regions of very different process dependency. For example, level sensors may not be able to measure sharp area boundaries in product topography. An example of extreme topography is seen for example in the manufacture of 3D NAND devices, where on backend layers (layers formed at a late stage in the manufacturing process) substantial height deviations can be seen over a distance ~100 μm.

SUMMARY OF THE INVENTION

It is desirable to generate high resolution wafer height maps and consequently improve wafer level alignment performance without adversely impacting throughput. It is further desirable that such improvement be obtained if possible using existing lithographic apparatus and associated hardware.

The invention in a first aspect provides an apparatus for applying a pattern onto a substrate using an optical projection system, the apparatus including:

an optical level sensor operable prior to applying said pattern for obtaining measurement signals related to a height of the substrate surface at many locations across the substrate;

a processor for deriving a height map of the substrate by converting said measurement signals into local height values for every location across the substrate; and a controller arranged to use said height map to control focusing of said projection system when applying said pattern, wherein said processor and controller are is further arranged to use information relating to processing previously applied to the substrate to define at least first and second regions of the substrate and to vary the manner in which said measurement signals are used to control focusing of the projection system between regions.

The invention further provides a method of manufacturing a device, the device being formed in multiple layers on a substrate, the method to form each layer comprising applying a pattern onto the substrate, and subjecting the substrate to one or more chemical and/or physical processing steps to form device features in accordance with the applied pattern, wherein for at least one of said layers the step of applying the pattern comprises:

using an optical level sensor to obtain measurement signals related to a height of the substrate surface at many locations across the substrate;

deriving a height map of the substrate by converting said measurement signals into local height values for every location across the substrate; and using said height map to control focusing of a projection system to apply said pattern, and wherein one or both of the steps of deriving a height map and using the height map are performed using information relating to processing applied to the substrate to define at least first and second regions of the substrate and to vary the manner in which said measurement signals are used to control focusing of the projection system between regions.

The variation in the manner of deriving height map data may for example be a variation in the way local height values are calculated from available measurement signals. The variation may be in whether measurement signals from a particular location are used in calculating height values at all. The variation in the manner in which height values are used may be in whether local height vales from certain regions are used by the controller. These and other examples can be used individually or in combination in a given implementation.

The invention yet further provides a computer program product comprising machine readable instructions stored in a transitory or non-transitory medium, the instructions being for causing a programmable processor to implement the processor functions of an apparatus as set forth above.

These and other aspects and advantages of the invention will be understood by the skilled reader from a consideration of the drawings and description of embodiments which follow.

BRIEF DESCRIPTION OF THE DRAWINGS

Embodiments of the invention will now be described, by way of example only, with reference to the accompanying drawings (the drawings are not necessarily drawn to scale) in which.

DETAILED DESCRIPTION OF EXEMPLARY EMBODIMENTS

Before describing embodiments of the invention in detail, it is instructive to present an example environment in which embodiments of the present invention may be implemented.

Figure 1:
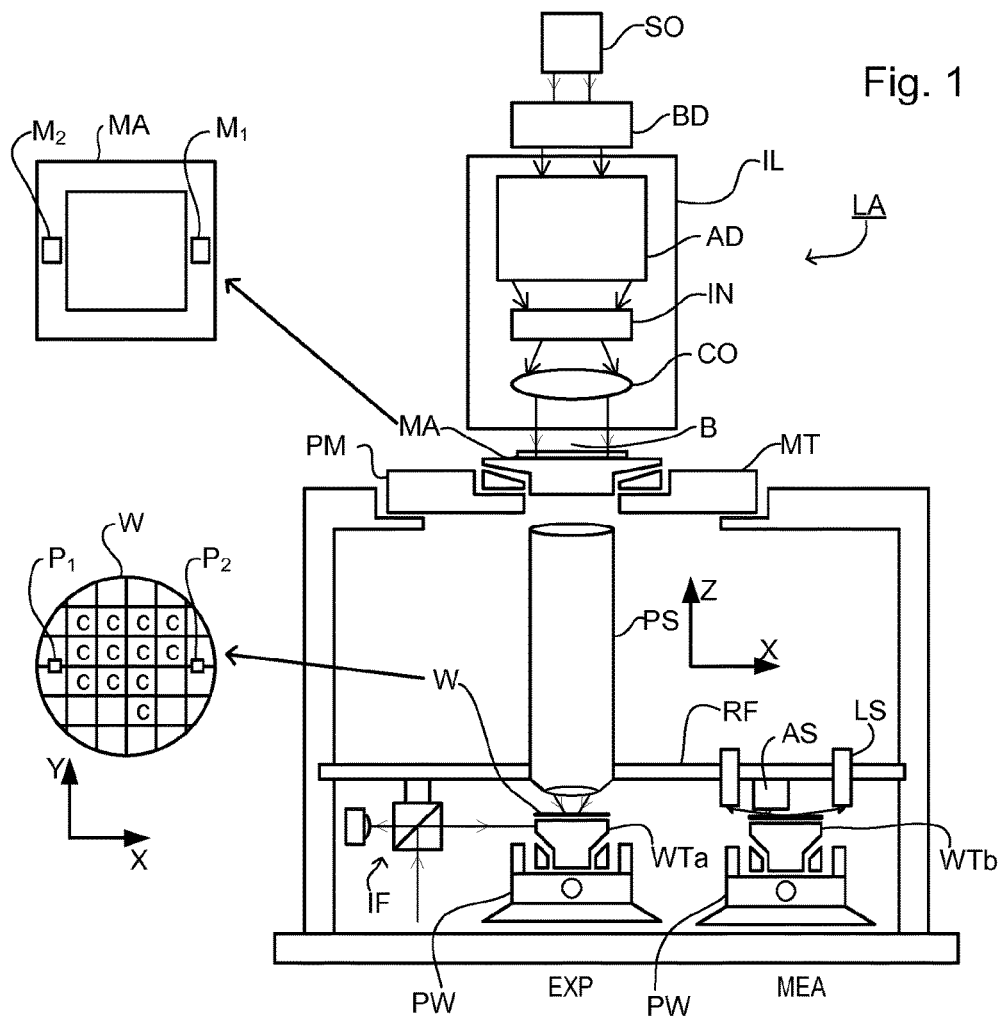
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography An example of a programmable mirror array employs a matrix arrangement of small mirrors, each of which can be individually tilted so as to reflect an incoming radiation beam in different directions The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the length (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned. Each target portion is commonly referred to as a "field", and contains one or more product dies in the finished product.

Combinations and/or variations on the above described modes of use or entirely different modes of use may also be employed.

Lithographic apparatus LA in this example is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. The preparatory steps may include mapping the surface height of the substrate using a level sensor LS and measuring the position of alignment markers on the substrate using an alignment sensor AS.

Figure 2:
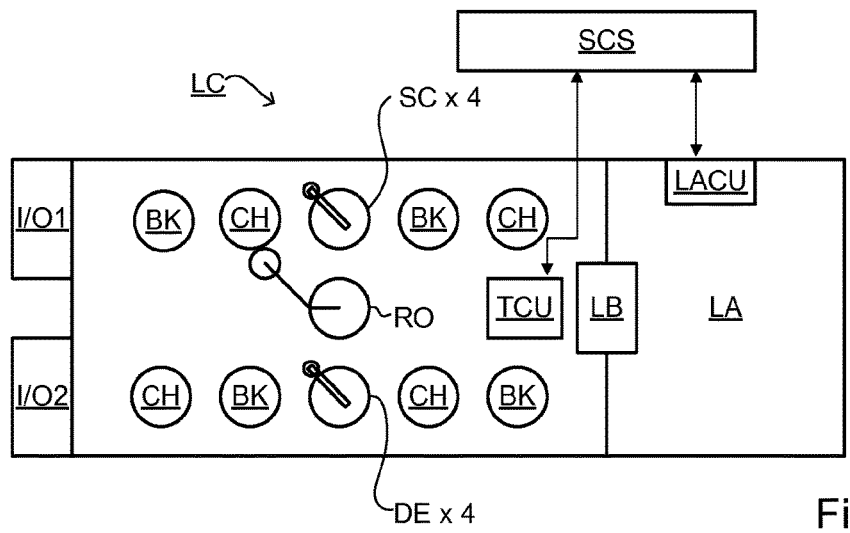
FIG. 2 depicts a lithographic cell or cluster incorporating the apparatus of FIG. 1.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency. The substrates processed by the track are then transferred to other processing tools for etching and other chemical or physical treatments within the device manufacturing process.

The lithographic apparatus control unit LACU controls all the movements and measurements of the various actuators and sensors described. LACU also includes signal processing and data processing capacity to implement desired calculations relevant to the operation of the apparatus. In the terminology of the introduction and claims, the combination of these processing and control functions referred to simply as the "processor" and the "controller". In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Patterning Process Background

Figure 3:
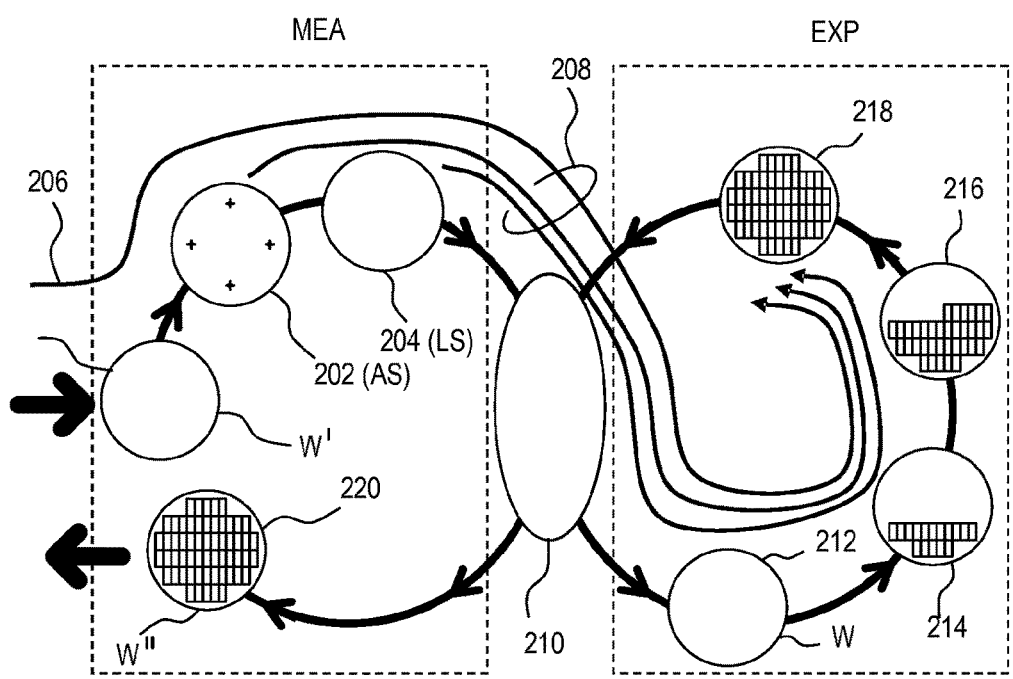
FIG. 3 illustrates schematically measurement and exposure processes in the apparatus of FIG. 1, according to known practice.

FIG. 3 illustrates the steps to expose target portions (e.g. dies) on a substrate W in the dual stage apparatus of FIG. 1. The process according to conventional practice will be described first.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving patterning performance, the task is to ensure that new patterns are applied with optimum focus on a substrate that has already been subjected to one or more cycles of patterning and processing. These processing steps progressively introduce distortions (local height deviations) in the substrate that must be measured and corrected for, to achieve satisfactory focus performance. Local height deviations are introduced also by deformation of the substrate caused when clamping it to the specific substrate table. These deformations are very slight, but significant when extremely high performance is required.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. The height map will be used to achieve accurate focusing of the exposed pattern.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. As will be explained below, in the novel methods described herein, the recipe and measurement data is supplemented with prior knowledge affecting how the height map is to be calculated from level sensor signals, at different regions across each substrate.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations and with respect to features previously laid down on the same substrate. The exposed substrate, now labeled W" is unloaded from the apparatus at step 220, to undergo etching or other processes, in accordance with the exposed pattern.

Even when advanced alignment models are used, manufacturing errors inevitably remain. An individual lithographic apparatus may also perform differently than other ones processing the same substrate. In order that the substrates that are exposed by the lithographic apparatus are exposed correctly and consistently, it is desirable to inspect exposed substrates to measure performance parameters such as slopes and/or contaminations that may be present on the wafer surface, overlay errors between subsequent layers, line thicknesses, critical dimensions (CD), etc.

An inspection apparatus, for instance a scatterometer, is therefore used to determine the properties of the substrates independently of the alignment sensors AS. The inspection apparatus (not shown in FIG. 2) may be integrated into the lithographic apparatus LA or the lithocell LC or may be a stand-alone device.

Level Sensor—Background

Figure 4A:
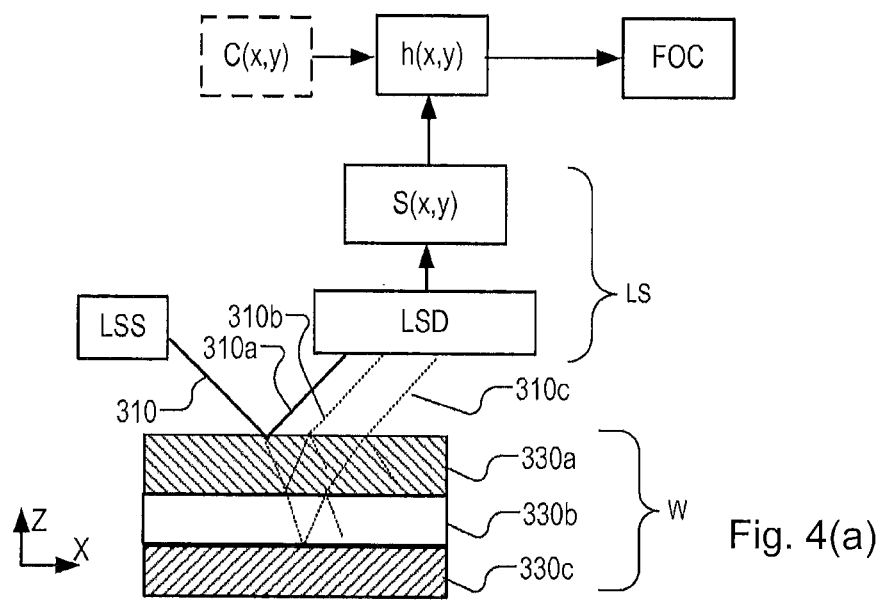
FIG. 4($a$) and FIG. 4($b$) depict schematically the operation of an optical level sensor in side view and in plan view respectively.

FIG. 4(a) illustrates schematically the operation of level sensor LS in the lithographic apparatus LA. As seen, this is an optical sensor, comprising a source side optics LSS, and detector optics LSD. Signal processing functions to deliver one or more signals S(x,y) usable for measuring height. The details of these optics for level sensing are known in the art and described for example in the prior publications mentioned in the introduction. They will not be described herein in detail. As explained further below, the radiation used in the present examples may be monochromatic, polychromatic and/or broadband. It may be P- or S-polarized, circularly polarized and/or unpolarized.

In operation, source side optics LSD generates one or more beams of light 310 that impinge onto a substrate W. Substrate W typically has different layers 330a, 330b, 330c formed on it, and typically many more layers than are illustrated here. A top layer will normally be the resist in which a pattern is to be formed, below that will be an anti-reflective coating and below that will be potentially many layers of device features formed in different layouts and materials. The beam of light 310 is reflected by the substrate surface and detected by detector side optics LSD to obtain a signal S(x,y) from which a measurement of the surface height at a position (x,y) on the substrate can be derived. By measuring height at numerous positions across the substrate, a height map h(x,y) can be obtained by a suitable processor, and used in the focus control FOC operation of the lithographic apparatus.

Figure 4B:
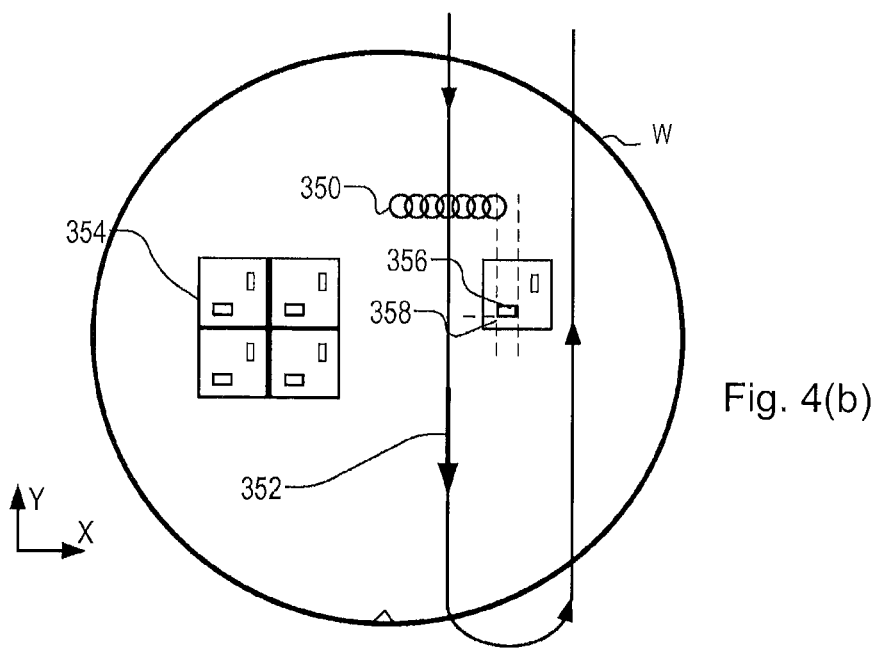

FIG. 4(b) depicts an example scanning procedure of the level sensor in plan view. As the level sensor is involved in the processing of every substrate in a and high throughput is required, multiple parallel beams 310 are provided so that height can be measured in parallel at multiple measurement spots 350. There may be for example five, or seven or more spots in a typical level sensor. The spacing of the spots may be, for example, of the order of 2 mm. Arrow 352 represents a scanning path. Level sensor LS operates in conjunction with the positioning systems PW of the substrate tables WTa, WTb so as to cover the substrate with measurement spots 350. The level sensor LS performs several scanning procedure over the wafer surface in order to obtain height measurements of the entire wafer. The sampling density in the Y direction can be finer than the sampling density in X, which is determined by the spacing of the spots 350. In the scanning operation of the lithographic apparatus when a pattern is applied at the exposure station EXP, focus can be controlled more finely in the Y direction than in the X direction, so the additional measurement density is useful. On the other hand, excessive sampling density in either direction is not justified.

Level sensors LS may be used during the manufacturing process (at a measurement station MEA) to provide a full height mapping data for each wafer. However, as mentioned previously, these optical sensors may be subject to process dependencies that may be translated to height errors. In addition, the resolution of these sensors may be limited. Process dependency arises in the measurements made by the level sensor because the incident beam of light 310 interacts in a complex way with the materials and patterns present at each part of the substrate. At a simplistic level, it can be envisaged that the beam undergoes of number of reflections and refractions at the successive layer interfaces of substrate 330, rather than only the top surface. Consequently, multiple individual rays 310a, 310b, 310c exiting substrate 330 are detected by detector side optics LSD at different positions. The interaction of radiation and materials is more complex in practice, and includes the Goos-Haenchen effect.

A height map derived from these mixed signals cannot accurately represent the true surface height at every point. Moreover, the errors in the measured height can vary significantly between neighboring regions on the substrate. Shape 354 represents a field on the substrate (target portions C in FIG. 1). Within each field, the same patterns are applied in each layer, and chemical and physical processing is applied to form product features. Due to this processing, regions 356 develop, where process dependency may have a particular character quite different from a neighboring region. It is known to provide corrections C(x,y) as shown in FIG. 4(a), based on prior measurements of sample substrates having the same layers and pattern. For example, the paper by Kahlenberg et al describes the use of air gauge sensors to derive a map of "process dependent offset" that defines offsets to be added to the measured height values, in different regions of the substrate. However, the offset map is only available in cases where the effort and expense of air gauge measurements has been undertaken.

Additionally, as mentioned, the sampling resolution of the level sensor in the Y direction may be quite limited, and the resolution in the X direction is limited by the spacing and diameter of measurement spots 350. In the example of FIG. 4(b), boundaries of region 356 may fall within a spot of spots 350 during the scanning of the wafer. Therefore, 'exact' values of the x and y-coordinates of, for example, corner 358 may not be traceable; consequently, X and Y coordinates of the boundaries of shape 356 may not be traceable from the level sensor signals. An air gauge or other profilometer will have similarly limited resolution.

As explained in U.S. Pat. No. 7,265,364 (Tuenissen et al.), level sensors conventionally operate with unpolarized, broadband radiation, for example in the visible part of the spectrum, and the radiation used will be referred to as 'light' without meaning to exclude non-visible wavelengths. U.S. Pat. No. 7,265,364 proposes a modified level sensor that is provided with filters in which light of different polarizations and/or different colors (wavelengths) can be used selectively. Comparison of signals obtained under these different characters of light can be processed to obtain information indicating for example the presence of process-dependent apparent surface depression at different regions of a substrate. While the modified sensor can detect which regions are subject to process dependency, however, it is not possible from the measured signals to know what corrections should be applied to obtain improved height values.

Improved Height Mapping Based on Prior Knowledge

While the above apparatuses and methods provide some improvements in focusing performance, modern devices require even smaller features and ever improving focus as a result. The inventors have recognized that a modern lithographic system in principle has available various forms of prior knowledge about the patterns and processes applied layer after layer to a substrate. These are the features that in practice contribute to the process dependency of the level sensor measurements at any given layer. According to the present disclosure, such prior information that is already available as a precursor to the patterning step, can be used to derive improved of height maps, without relying on additional measurements, or as a supplement to additional measurements, where available. Process history information specifies which of the layers have been applied, and with what physical and/or chemical processing steps. Layout information for each of the previously applied layers is available for example in computer-aided design files in formats such as GDSII (Graphic Data System) or OASIS. Additional detail not contained in the layout files is often obtained by mathematical modeling of the three-dimensional interaction between patterning radiation and critical features of reticles and/or of wafers signatures. One system for reticle modeling is called is described in P. Liu et al., "Fast 3D thick mask model for full-chip EUVL simulations", Proc. SPIE 8679, Extreme Ultraviolet (EUV) Lithography IV, 86790 W (Apr. 1, 2013). Similarly a system for modeling three-dimensional interactions at the substrate is described in P. Liu et al., "A full-chip 3D computational lithography framework", Proc. SPIE 8326, Optical Microlithography XXV, 83260A (Feb. 21, 2012). Products implementing these techniques are available from BRION Technologies, Santa Clara, Calif.

Figure 10:
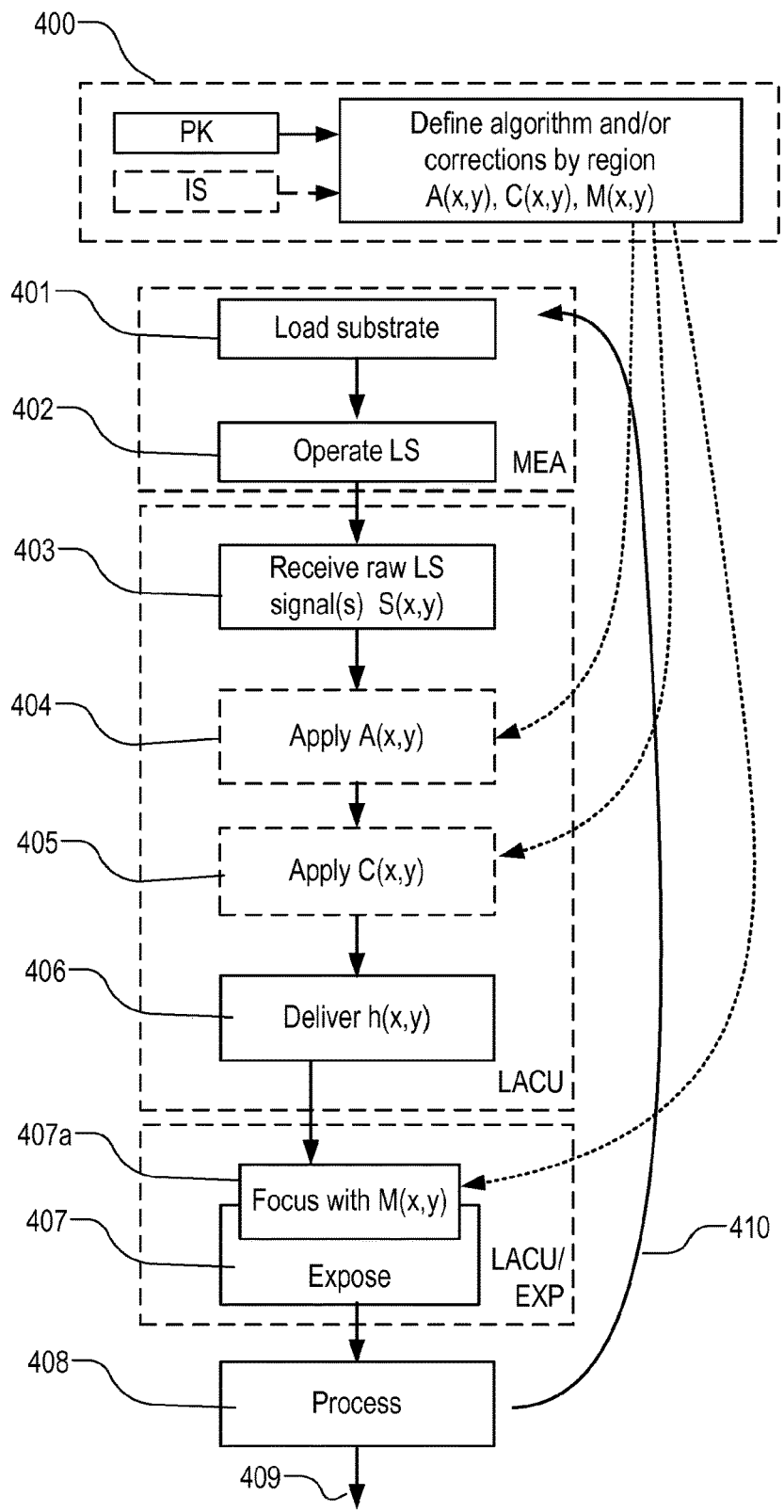

The present disclosure presents a method for generating more accurate height maps by using the prior knowledge, such as stored/known process history, layout information and/or numerical simulations, to modify the way in which height map is derived from the 'real-time' signals recorded by level sensors within the mass-production operations of a lithographic apparatus. The aim is to optimize focus control with higher accuracy and/or higher spatial resolution than known techniques. In the present example, this is done through calculation of an improved height map. FIG. 10, described below illustrates a alternative method, in which the prior knowledge is applied directly in a focus control process, rather than indirectly through the medium of the height map.

Figure 5:
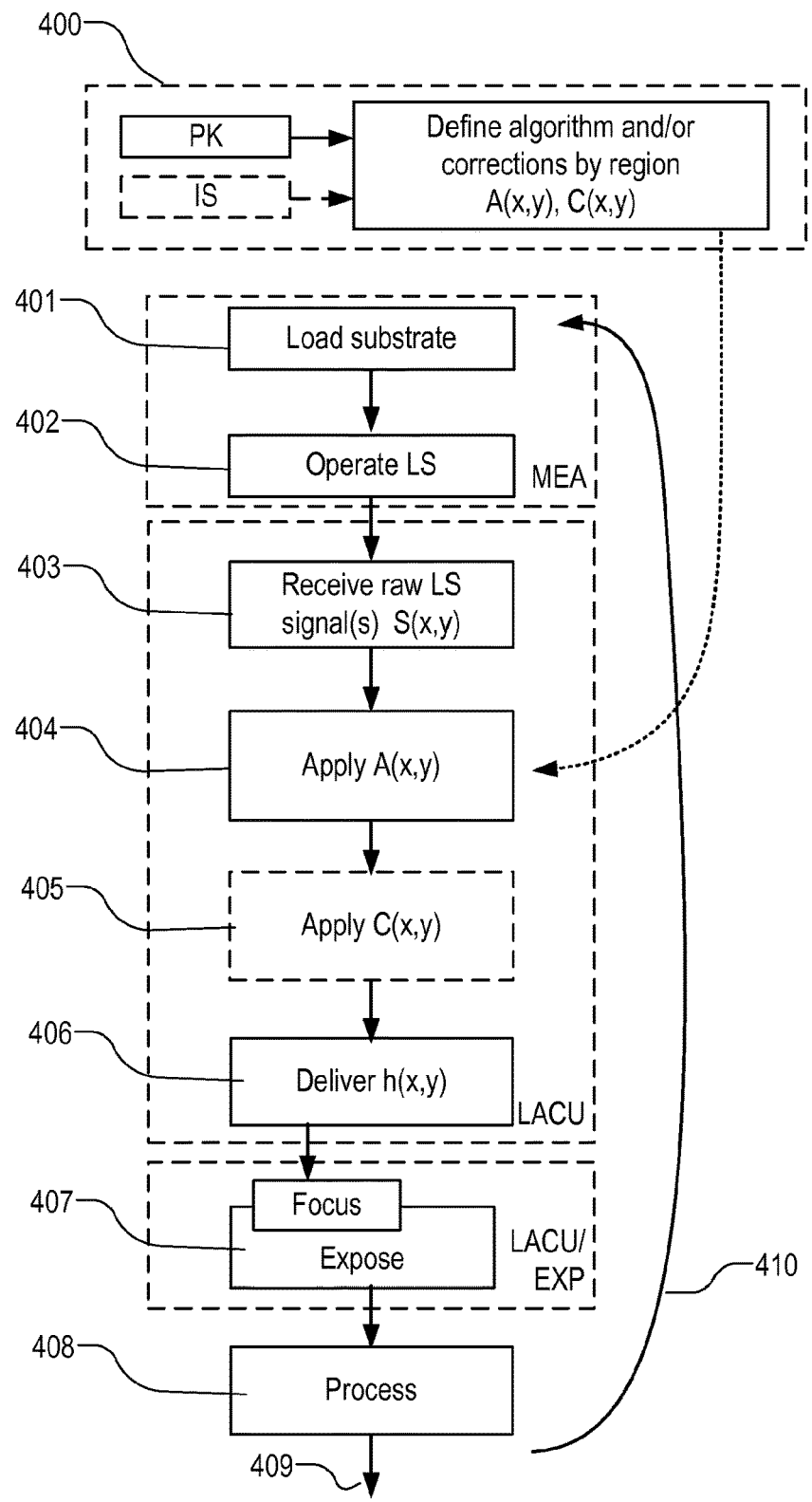
FIG. 5 depicts in flowchart form a method of manufacturing devices according to a generalized embodiment of the present invention.

FIG. 5 shows in schematic flowchart form a device manufacturing method according to an embodiment of the present disclosure.

Step 400 represents an offline set-up procedure. Based on prior knowledge PK, one or more algorithms are defined which are to be used to derive height map data for different regions of the substrate. These algorithms are represented generically by a function A(x,y) which transforms raw signals from the level sensor to local height information for location (x,y). Particular forms of algorithm including for example excluded areas and boundary regions will be described in examples further below. Also in the set-up, there may be defined local height corrections C(x,y) that may be applied after derivation of an initial height measurement, in the same manner as the offset map obtained from the air gauge in the Kahlenberg paper, mentioned above. Indeed, the algorithms and corrections can be defined partly on the basis of information from non-optical inspection apparatus IS (for example an air gauge or profilometer), as well as from the prior knowledge PK.

In the "online" manufacturing process, at 401 a substrate (for example a semiconductor wafer) is loaded into the measurement station MEA of the lithographic apparatus and at 402 the level sensor is used in the manner described in FIGS. 4 (a) and (b) to obtain measurement signals S(x,y) related to a height of the substrate surface at many locations across the substrate. At 403 a processor (for example a main processor of the control unit LACU or a separate processor associated with the height mapping function) receives the measurement signals S(x,y). In particular embodiments to be described, these signals S(x,y) arrive in multiple versions according to different characters of radiation used to obtain them (different polarization and or wavelength).

At 404 the processor derives a height values for each point on the substrate by converting said measurement signals into local height values according to the algorithm A(x,y) specified for each location across the substrate. As mentioned, the present disclosure envisages that this algorithm derives the height values differently in different regions of the substrate, based on the prior knowledge obtained in the set-up step 400. Furthermore, the algorithm may derive the height values with a spatial resolution greater than the sampling resolution of the level sensor signals S(x,y).

As a simple illustration of different processing for different regions, the algorithm A(x,y) may define that certain areas are to be excluded from direct measurement of height, because extreme process dependency makes the raw signals S(x,y) unreliable as an indicator of height in those regions. These unreliable measurements would not only cause trouble for focusing on the region in question, but might disturb the focusing of the projection system on the neighboring regions. The algorithm therefore discounts measurement signals from the designated region and performs an interpolation or extrapolation of height values over this region, based on measurements made in one or more neighboring regions. At step 405, correction terms may be applied, depending on the application. This may be a mechanism for applying an offset to the interpolated/extrapolated height values in an excluded region, based on prior knowledge PK or measurement by non-optical sensors IS.

At step 406, a refined, high resolution height map h(x,y) is generated and 'delivered' to control unit LACU. The height map is used at step 407 while the substrate is in the exposure station EXP, to control focusing of the projection system. After exposure at 408 the resist layer carrying the transferred pattern is developed in the track (FIG. 2) and then subjected to whatever chemical and physical processes are required to form the device features in the new layer. The process steps will vary depending on the application. After step 408, the device may be complete (409) or it may return to step 401 for patterning and processing further layers (410). For each repetition, the set-up step may define a different set of regions, algorithms and corrections. For some layers, where focus is not critical, the height mapping may be performed in a conventional way.

The variation of algorithm A(x,y) and corrections C(x,y) between different regions, based on prior knowledge PK, may be a combination of several contributions calculated and applied separately. Variations may be gradual or stepwise. For example, a certain variation may be applied to specific regions within every field of the wafer. These may be referred to as intrafield variations and be based in particular on layout information of one or more layers previously applied to the substrate. Other variations may be defined that take place more gradually across the whole substrate. These variations, which may be referred to as interfield variations, may be defined for example to account for the effects of chemical or physical processing recorded in the process history information part of the prior knowledge. For example, deposition steps and steps such as chemical-mechanical polishing (CMP) may cause systematic variations in the thickness or dielectric constant or refractive index of some material, across the whole substrate. To take account of these different types of causes and effects, the local variations algorithm A(x,y) and/or local corrections C(x,y) can be defined as a combination of separate intrafield and interfield contributions. The regions need not be large regions, and can be as small as an individual sample location, if desired.

Figure 6:
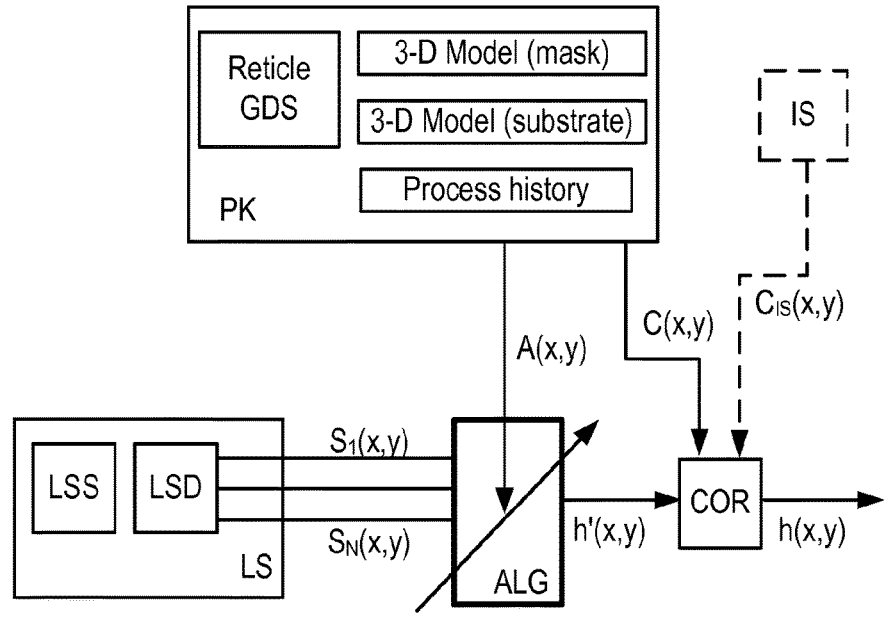
FIG. 6 is a block schematic diagram of signal processing and data processing operations for obtaining height maps in a generalized embodiment of the invention.

FIG. 6 shows in block schematic form a generalized implementation of processing procedures of the disclosed method and apparatus. In the diagram, LS represents the optical level sensor which produces multiple raw signals S1(x,y) to Sn(x,y), each corresponding to a different character of light at the source and/or detector side. In one implementation, a controller (not shown) controls movable filters at the source side and/or detector side, as described in U.S. Pat. No. 7,265,364, mentioned above. Alternatively, parallel optical paths and measurement spots can be provided each with different characteristics. In other words, signals corresponding to illumination and/or detection of different characters of light can be obtained by time division multiplexing through the same optical path, or by spatial multiplexing.

ALG represents one or more procedures or formulae for converting the multiple raw signals into at least preliminary height values h'(x,y). COR represents procedures to apply one or more local correction functions C(x,y), (including potentially a correction $C_{IS}$(x,y) based on non-optical measurements) to obtain a final height map h(x,y). The manner of conversion and/or correction is different in different regions of the substrate, based on one or more elements of prior knowledge PK. Regions are readily defined by their coordinate position (x,y), although it may be convenient sometimes to define them by radial and/or polar coordinates. For example, in a first region, a first one of the raw data signals may be selected as the basis for calculating local height values, while another one of the raw signals is selected in a second region. Alternatively, weighted combinations of several raw signals may be used to calculate height in the first and second regions, but weighted differently in different regions. As already mentioned, the conversion may be done by interpolation or extrapolation from height values calculated from raw signals obtained in a neighboring region. The interpolation may alternatively be done in the domain of the raw signals, before conversion from the interpolated signals to height values.

Referring to the correction step COR, IS represents an optional use of additional non-optical inspection apparatuses such as Air Gauge, profilometer etc. Recall non-optical sensors may be employed to measure unambiguously the true height of specific fields of a few wafer samples, but such sensors are not available within the lithographic apparatus and/or are not operable at every location on every substrate. Signals obtained with non-optical sensors on a few sample fields and substrates may then be compared to signals obtained with an optical level sensor LS and used to calculate corrections $C_{IS}$(x,y). Such corrections may be particularly useful in the regions where height values are to be calculated by extrapolation or interpolation between neighboring areas. As already mentioned, the spatial resolution in x and y may be greater in the delivered height map h(x,y) than it is in the raw signals S(x,y). The interpolation and/or up-sampling involved in this can be performed within the before, during or after conversion to preliminary height values h'(x,y).

Figure 7:
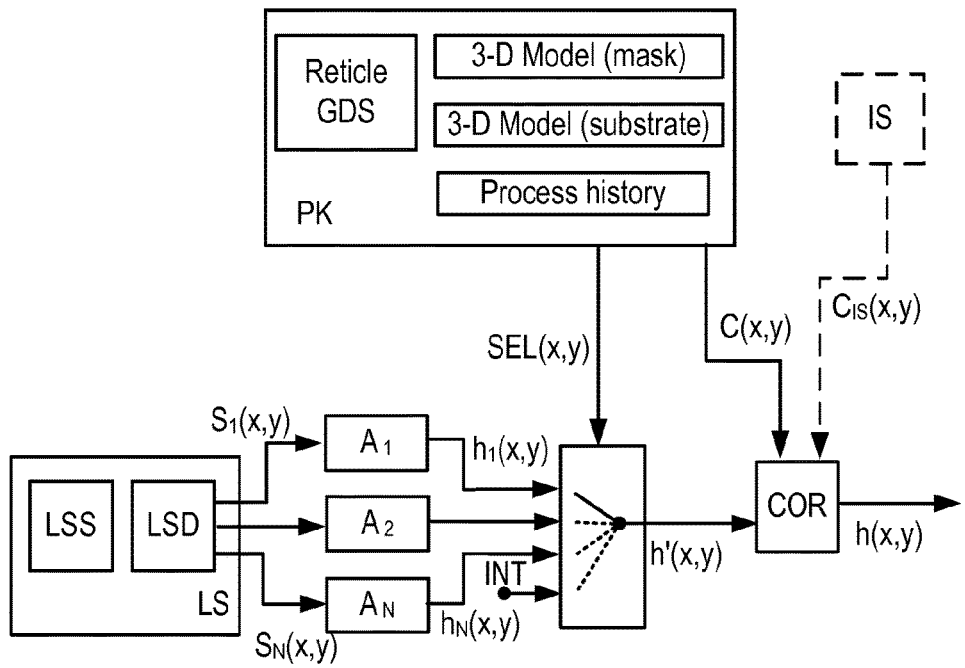
FIG. 7 is a block schematic diagram of signal processing and data processing operations for obtaining height maps in a first practical embodiment of the invention.

FIG. 7 illustrates a specific, exemplary implementation of a processing procedure of the present method. In this example, each of the raw signals $S_1$ to $S_N$ is converted by a respective algorithm $A_1$ to $A_N$ to produce a corresponding candidate height values $h_1$ to $h_N$. The algorithms $A_1$ to $A_N$ do not vary with position (x,y) across the field or substrate, which makes for simple processing. On, the other hand, a selection signal SEL(x,y) is generated on the basis of the prior knowledge PK, so that a different one of the candidate height values $h_1$ to $h_N$ can be selected for use in any region of the substrate. Another option labeled INT can be selected for a region, to perform interpolation instead of using any of the level sensor signals. Corrections C(x,y) and $C_{IS}$(x,y) can be applied as before, to deliver a height map for controlling focus of the projection system.

Other implementations are possible, as already mentioned. Note that the function of varying the derivation of the height map h(x,y) between regions can be implemented in the conversion from raw signal S to height and/or in corrections applied after conversion to height. In principle, one could even implement the variations in pre-processing of the raw signals, before conversion to height.

Example Application of the Improved Height Mapping

Figure 8:
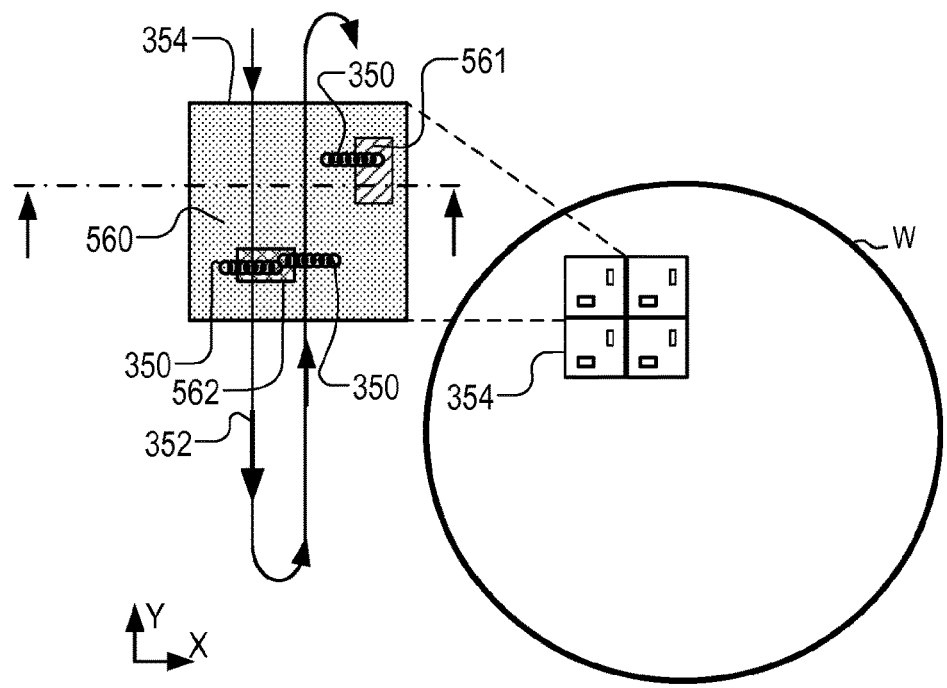
FIG. 8 is an illustration of a level sensor scanning operation illustrating features of the embodiment of FIG. 7.

FIG. 8 recalls FIG. 4(b) and depicts an example scanning procedure over various fields 354 on a substrate W. Reference signs the same as in FIG. 4(b) represent the same features or events. Within each field 354, three distinct regions are defined in the set-up step 400. Most of the field constitutes a first region 560. Second and third regions 561 and 562 are defined based on prior knowledge as described above. These regions correspond to parts of the field where specific patterns and/or processing steps have been applied in previous iterations of the lithographic method shown in FIG. 4. The level sensor LS executes one or more scans along the path 352, so as to obtain a variety raw signals S(x,y) for each location in x and y.

Figure 9:
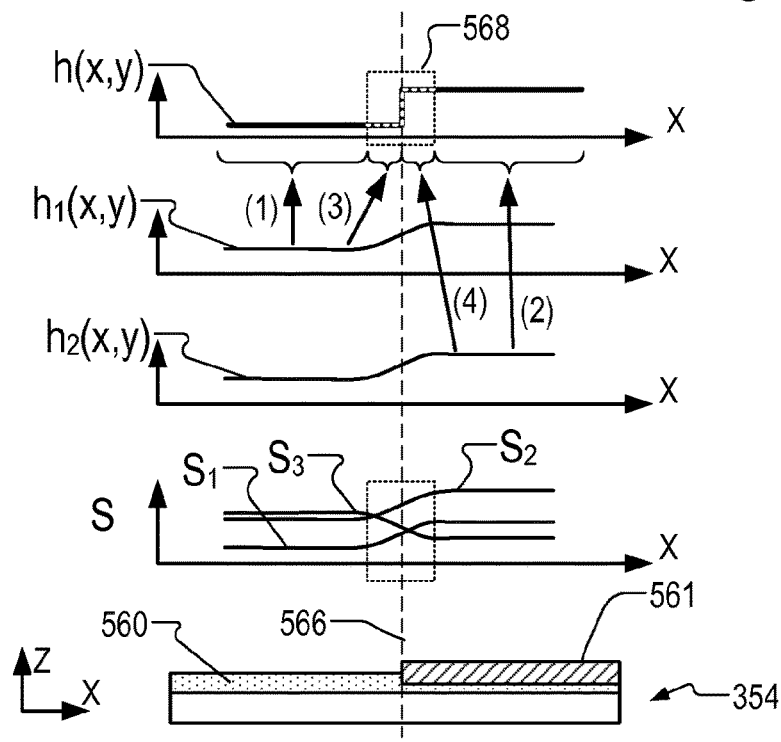
FIG. 9 illustrates calculation of extrapolated or interpolated height values using the measurements made in FIG. 8.

FIG. 9 illustrates at the bottom a cross-sectional detail through the field 354 along the line X-X' in FIG. 8. Above that, various signals and data values in the processing steps of the of the method are illustrated schematically as graphs, all aligned to the same X axis. A line 566 marks the boundary between regions 560 and 561. A graph with axis labelled S shows three example raw data signals $S_1$, $S_2$, $S_3$ as functions of position X. Each signal exhibits a step change between different values in the two regions 560, 561. However, it is not known by the level sensor which if any of these steps represents a true change in surface height between the regions, and which is an artifact of their different optical properties, causing an apparent surface depression in one or other of the regions. As also illustrated in these graphs, due to the limited resolution of optical level sensor LS, the step change between values in the region of boundary is rather indistinct in the signals S. The exact x coordinate of a sharp boundary of region 561 may be not be traceable from the level sensor signals $S_1(x,y)$, which are rather indistinct in the region 567 around boundary 566. Particularly with modern high-density circuitry such as 3D NAND devices, quite substantial height steps may in fact be present.

In accordance with an embodiment of the present disclosure, prior knowledge of layout and other properties of the substrate is used (a) to specify which signal or combination of signals should be used to obtain height information in each region, and (b) to define with a high spatial resolution exactly where the boundary of the regions should be drawn. Using the example implementation of FIG. 7, suppose that the selection signal SEL(x,y) is defined (based on prior knowledge PK) so as to choose a first converted height value $h_1(x,y)$ at points within the first region 560 and to use a second converted height value $h_2(x,y)$ at points within the second region 561. A boundary region 568 is defined in the vicinity of the boundary, in accordance with the known position of the boundary 566 and the known low spatial resolution of the optical level sensor LS. To the left of the boundary region 568 the height values $h_1(x,y)$ calculated from signals $S_1$ are used to generate the output height map data h(x,y), as indicated schematically by arrow (1). To the right of the boundary region 568, the height values $h_2(x,y)$ derived from signal $S_2$ are used to generate the output height map data (arrow (2)). In a boundary region 568 extending a distance either side of the known boundary, measurement signals S are not used at all. Instead, height values measured in the first region at locations away from the boundary are extrapolated from the left hand side (arrow (3) into the boundary region 568 up to the location of the boundary 566 that is known with high precision from the layout information (GDS, OASIS etc), and height values measured in the second region 561 at locations away from the boundary 566 are extrapolated from the right hand side (arrow (4)) into the boundary region 568 up to the location of the boundary 566. The output height map can have a much greater sampling density than the raw measurement signals, and this higher resolution height map can be generated with high resolution information derived from the layout information and other prior knowledge.

Correction terms may be applied to obtain final height measurements at h(x,y), as described above (not shown in FIG. 9). As a particular example, the height map data in one or other of the regions may be modified with a correction term obtained using non-optical sensors. As an alternative example, based on the known methods of applying corrections based on non-optical measurements, the prior knowledge such as layout information may simply be used to position boundaries of the corrected regions more precisely.

As to the third region 562, the prior knowledge may be used to specify yet another algorithm to calculate height values, or it may be an excluded area where height map data will be interpolated between values measured in the surrounding first region 560.

As illustrated in FIG. 4(*b*), the refined height maps can then be used to improve focusing FOC of a newly applied pattern, using just the level sensor measurements obtained during measurement of full wafer at standard throughput levels. It will be appreciated that the exposure step, whether it is using a scanning slit of radiation or some other system, cannot focus every part of the field independently. Typically, the achieved focus is a compromise based on a moving average of height measurements. Using the additional information to modify the creation of the height map used for focus control, this average can be made so that all locations will be within a usable depth of focus. As already explained, the prior knowledge can be used to identify measurements made in regions where focusing is not critical, and/or where measured heights are unreliable. The modified height map ensures that these measurements are ignored (wholly or partially) in the averaging process, thereby enhancing the focus in critical regions.

Improved Focus Control Based on Prior Knowledge

FIG. 10 illustrates an alternative example in which prior knowledge is used to influence the manner in which the height map is used to control focus, as an alternative to or in addition to modifying the calculation of the height map. The process in FIG. 10 is very similar to that illustrated in FIG. 5, and will not be described again in detail. The aim again is to use prior knowledge in the overall function of focus control, so that all locations will be within a usable depth of focus. In the prior example (FIG. 5), this is done by modifying the manner in which the height map data is created, and then using the modified height map in the conventional focus control process. In the FIG. 10 example, a focus control function 407*a* within the exposure step 407 is modified based on the prior knowledge.

In the illustrated example, a height weighting mask M(x, y) is created based on the prior knowledge, which modifies the way the focus control process uses the height map data. The height map data in this example may or may not also have been calculated by reference to prior knowledge. (In other words, the steps 404 405 are optional.) The height weighting mask is an array or other function of location (x,y), whose value determines how much weight is given to height map data h(x,y) at that location, in calculating the optimum focus. So, for example, height weighting mask M(x,y) may be a simple binary function so that a '0' will cause a corresponding height map entry to be ignored by the focus control. In this way, the prior knowledge encoded in function M(x,y) can be used to identify measurements made in regions where focusing is not critical, and/or where measured heights are unreliable. The modified focus control step 407*a* ensures that these measurements are ignored in the averaging process, thereby enhancing the focus in critical regions. Instead of a simply binary function, a multi-valued weighting function could be used, for finer control. Thus the focus arranged to weight height map data differently in first and second regions, when calculating an optimum focus. The first and second regions for this purpose need not be large regions, and can be as small as an individual sample location, if desired. In addition to or alternatively to a height weighting function, another way for prior knowledge to be used to influence control of focusing would be a focus height offset. Like the local height correction C(x,y) described above, this would be an offset dependent on X-Y position, to be added to a focus height calculated from the height map data.

In a case where the height weighting mask M(x,y) or other focus correction is applied to reduce influence of unreliable measurement signals in the control of focusing, the prior knowledge used will generally be knowledge of the processing and/or layout applied previously to the substrate. In a case where the height weighting mask or other focus correction is applied to reduce the influence of local height values for non-critical parts of the pattern being applied, it is more likely that the prior knowledge being applied will be derived from layout information of the present layer. Both types of variation can of course be applied in a single embodiment, either through a combined mask or correction, or through respective masks/corrections applied together.

It may be an advantage of the FIG. 5 method, that the focus control process 407a, which is a critical real-time process in any lithographic apparatus, is not disturbed and improved focus is achieved through the existing medium of the height map data. On the other hand, the method of FIG. 10 may allow more direct optimization of the focus. As illustrated in FIG. 10 itself, both types of process can be used together.

CONCLUSIONS

In conclusion, the present disclosure provides methods enabling improved focusing and improved patterning performance, during the lithographic manufacturing process. The present method computationally corrects optical sensors errors without relying on additional measurements made by 'non optical' sensors. This novel method may be implemented as an enhancement to non-optical metrology, however. Furthermore, the novel method requires no change in the hardware of a lithography system and uses as input data, data that have already been measured and stored during the lithographic manufacturing process. The method may include generating more accurate height maps (meaning simply height maps modified to achieve more optimal focusing of critical features), and/or to modify the way height map data is used in the actual focus control process.

An embodiment of the invention may be implemented using a computer program containing one or more sequences of machine-readable instructions describing methods of controlling the lithographic apparatus using height map data as described above. This computer program may be executed for example within the control unit LACU of FIG. 2, or some other controller. There may also be provided a data storage medium (e.g., semiconductor memory, magnetic or optical disk) having such a computer program stored therein.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The present disclosure further comprises the following aspects, presented as numbered clauses:

1. A lithographic apparatus for applying a pattern onto a substrate using an optical projection system, the apparatus including:
    an optical level sensor operable prior to applying said pattern for obtaining measurement signals related to a height of the substrate surface at many locations across the substrate;
    a processor for deriving a height map of the substrate by converting said measurement signals into local height values for every location across the substrate; and
    a controller arranged to use said height map to control focusing of said projection system when applying said pattern, wherein said processor and controller are further arranged to use information relating to processing applied to the substrate to define at least first and second regions of the substrate and to vary the manner in which said measurement signals are used to control focusing of the projection system between regions.

2. An apparatus according to clause 1 wherein said processor is arranged to derive said local height values in said first region by applying a first calculation to said measurement signals and in said second region by applying a second calculation to said measurement signals.

3. An apparatus according to clause 2 wherein said optical level sensor is operable to obtain a plurality of measurement signals using radiation of different properties, and wherein the manner in which said first and second measurement signals are used is different between the first and second calculations.

4. An apparatus according to clause 3 wherein said radiation of different properties includes radiation of different polarizations.

5. An apparatus according to clause 3 or 4 wherein said radiation of different properties includes radiation of different wavelengths.

6. An apparatus according to any preceding clause wherein said information relating to processing applied to the substrate includes layout information of one or more previously patterned layers and is used to define boundaries of said first and second regions.

7. An apparatus according to clause 6 wherein said information relating to processing applied to the substrate includes information on material properties in the first and second regions of said one or more previously patterned layers.

8. An apparatus according to clause 6 or 7 wherein said layout information is used to define said boundaries with a spatial precision greater than a spatial precision of said level sensor.

9. An apparatus according to any preceding clause wherein said processor is arranged to derive said local height values in said first region of the substrate from measurement signals obtained at locations in the first region and to derive said local height values in said second region by extrapolating from measurement signals obtained in a neighboring first region.

10. An apparatus according to any preceding clause wherein said information relating to processing applied to the substrate includes layout information of one or more previously patterned layers and is used to define a third region spanning a boundary between said first and second regions, and said processor is arranged to derive said local height values in a first part of said third region by extrapolating from measurement signals obtained in at neighboring locations in said first region and to derive said local height values in a second part of said third region by extrapolating from measurement signals obtained at neighboring locations in said second region.

11. An apparatus according to any preceding clause wherein said controller is arranged to use said height map data differently in different regions, when controlling focusing of the projection system.

12. An apparatus according to clause 11 wherein said information relating to processing applied to the substrate includes layout information of a presently patterned layer and is used to define boundaries of said different regions.

13. An apparatus according to clause 11 or 12 wherein said controller is arranged to apply different weights to height map data in the different regions, when controlling focusing of said projection system.

14. A method of manufacturing a device, the device being formed in multiple layers on a substrate, the method to form each layer comprising applying a pattern onto the substrate, and subjecting the substrate to one or more chemical and/or physical processing steps to form device features in accordance with the applied pattern, wherein for at least one of said layers the step of applying the pattern comprises:
using an optical level sensor to obtain measurement signals related to a height of the substrate surface at many locations across the substrate;
deriving a height map of the substrate by converting said measurement signals into local height values for every location across the substrate; and
using said height map to control focusing of a projection system to apply said pattern,
and wherein one or both of the steps of deriving a height map and using the height map are performed using information relating to processing applied to the substrate to define at least first and second regions of the substrate and to vary the manner in which said measurement signals are used to control focusing of the projection system between regions.

15. A method according to clause 14 wherein said local height values are derived in said first region by applying a first calculation to said measurement signals and in said second region by applying a second calculation to said measurement signals.

16. A method according to clause 15 wherein said optical level sensor is used to obtain a plurality of measurement signals using radiation of different properties, and wherein the manner in which said first and second measurement signals are used is different between the first and second calculations.

17. A method according to clause 16 wherein said radiation of different properties includes radiation of different polarizations.

18. A method according to clause 16 or 17 wherein said radiation of different properties includes radiation of different wavelengths.

19. A method according to any of clauses 14 to 18 wherein said information relating to processing applied to the substrate includes layout information of one or more previously patterned layers and is used to define boundaries of said first and second regions.

20. A method according to clause 19 wherein said information relating to processing applied to the substrate further includes information on material properties in the first and second regions of said one or more previously patterned layers.

21. A method according to clause 19 or 20 wherein said information relating to processing applied to the substrate further includes information obtained from modeling 3-dimensional interaction between radiation and one or both of a patterning device and the substrate.

22. A method according to any of clauses 14 to 21 wherein said step of using the height map is performed so as to use said height map data differently in different regions, when controlling focusing of the projection system.

23. A method according to clause 22 wherein said information relating to processing applied to the substrate includes layout information of a presently patterned layer and is used to define boundaries of said different regions.

24. A method according to clause 22 or 23 wherein different weights are applied to said height map data in the different regions, when controlling focusing of said projection system.

25. A computer program product comprising machine readable instructions stored in a transitory or non-transitory medium, the instructions being for causing a programmable processor to implement the processor and/or controller functions of an apparatus according to any of clauses 1 to 13.

The invention claimed is:

1. A lithographic apparatus for applying a pattern onto a substrate using an optical projection system, the apparatus comprising:
an optical level sensor configured to, prior to applying the pattern, obtain measurement signals related to a height of the substrate surface at many locations across the substrate;
a processor configured to derive a height map of the substrate by converting the measurement signals into local height values for the many locations across the substrate; and
a controller configured to use the height map to control focus with respect to the projection system when applying the pattern,
wherein the processor and controller are further configured to use information relating to physical processing previously applied to modify the substrate to define at least first and second regions of the substrate and to vary the manner in which the measurement signals are used to control focus with respect to the projection system, between the first and second regions,
wherein the processor is configured to derive the local height values in the first region by applying a first calculation to the measurement signals and in the second region by applying a second calculation to the measurement signals, and
wherein the optical level sensor is configured to obtain a plurality of measurement signals using radiation of different properties, and wherein the manner in which the measurement signals are used is different between the first and second calculations.

2. An apparatus as claimed in claim 1, wherein the information relating to processing applied to the substrate includes layout information of one or more previously patterned layers and is used to define boundaries of the first and second regions.

3. An apparatus as claimed in claim 2, wherein the layout information is used to define the boundaries with a spatial precision greater than a spatial precision of the level sensor.

4. An apparatus as claimed in claim 1, wherein the processor is configured to derive the local height values in the first region of the substrate from measurement signals obtained at locations in the first region and to derive the local height values in the second region by extrapolating from measurement signals obtained in a neighboring first region.

5. An apparatus as claimed in claim 1, wherein the controller is configured to use the height map data differently in different regions, when controlling focus with respect to the projection system.

6. An apparatus as claimed in claim 5, wherein the information relating to processing applied to the substrate includes layout information of a presently patterned layer and is used to define boundaries of the different regions.

7. An apparatus as claimed in claim 1, wherein the information relating to processing applied to the substrate includes information on material properties in the first and second regions of one or more previously patterned layers.

8. An apparatus as claimed in claim 1, wherein the controller is configured to apply different weights to height map data in the different regions, when controlling focus with respect to the projection system.

9. A method of manufacturing a device, the device being formed in multiple layers on a substrate, the method to form each layer comprising applying a pattern onto the substrate, and subjecting the substrate to one or more chemical and/or physical processing steps to form device features in accordance with the applied pattern, wherein for at least one of the layers the step of applying the pattern comprises:
using an optical level sensor to obtain measurement signals related to a height of the substrate surface at many locations across the substrate;
deriving a height map of the substrate by converting the measurement signals into local height values for the many locations across the substrate; and
using the height map to control focus with respect to a projection system to apply the pattern,
wherein the deriving a height map and/or the using the height map is performed using information relating to physical processing previously applied to modify the substrate to define at least first and second regions of the substrate and to vary the manner in which the measurement signals are used to control focus with respect to the projection system, between the first and second regions,
wherein the local height values are derived in the first region by applying a first calculation to the measurement signals and in the second region by applying a second calculation to the measurement signals, and
wherein the optical level sensor is used to obtain a plurality of measurement signals using radiation of different properties, and wherein the manner in which the measurement signals are used is different between the first and second calculations.

10. A method as claimed in claim 9, wherein the information relating to processing applied to the substrate includes layout information of one or more previously patterned layers and is used to define boundaries of the first and second regions.

11. A method as claimed in claim 10, wherein the information relating to processing applied to the substrate further includes information on material properties in the first and second regions of the one or more previously patterned layers.

12. A method as claimed in claim 9, wherein the using the height map is performed so as to use the height map data differently in different regions, when controlling focus with respect to the projection system.

13. A method as claimed in claim 9, wherein the information relating to processing applied to the substrate includes layout information of a presently patterned layer and is used to define boundaries of the different regions.

14. A method as claimed in claim 13, wherein the information relating to processing applied to the substrate further includes information obtained from modeling 3-dimensional interaction between radiation and a patterning device, the substrate, or both the patterning device and the substrate.

15. A method as claimed in claim 9, wherein the information relating to processing applied to the substrate further includes information obtained from modeling 3-dimensional interaction between radiation and a patterning device, the substrate, or both the patterning device and the substrate.

16. A method as claimed in claim 12, wherein different weights are applied to the height map data in the different regions, when controlling focus with respect to the projection system.

17. A non-transitory computer-readable medium comprising instructions configured to cause a computer system to at least:
obtain measurement signals, from an optical level sensor, related to a height of a surface of a substrate at many locations across the substrate;
derive a height map of the substrate by converting the measurement signals into local height values for the many locations across the substrate; and
provide control information, based on the height map, for control of focus of a projection system to apply a pattern onto the substrate,
wherein the derivation of the height map and/or the provision of the control information based on the height map is performed using information relating to physical processing previously applied to modify the substrate to define at least first and second regions of the substrate and to vary the manner in which the measurement signals are used to control focus with respect to the projection system, between the first and second regions,
wherein the local height values are derived in the first region by applying a first calculation to the measurement signals and in the second region by applying a second calculation to the measurement signals, and
wherein the optical level sensor is used to obtain a plurality of measurement signals using radiation of different properties, and wherein the manner in which the measurement signals are used is different between the first and second calculations.

18. A computer-readable medium as claimed in claim 17, wherein the information relating to processing applied to the substrate includes layout information of one or more previously patterned layers and is used to define boundaries of the first and second regions.

19. A computer-readable medium as claimed in claim 17, wherein the instructions are configured to derive the local height values in the first region of the substrate from measurement signals obtained at locations in the first region and to derive the local height values in the second region by extrapolating from measurement signals obtained in a neighboring first region.

20. A computer-readable medium as claimed in claim 17, wherein the information relating to processing applied to the substrate includes information on material properties in the first and second regions of one or more previously patterned layers.

* * * * *